United States Patent
Montoya et al.

(10) Patent No.: US 6,421,236 B1
(45) Date of Patent: Jul. 16, 2002

(54) HOT SWAP DISK DRIVE CARRIER AND DISK DRIVE BAY

(75) Inventors: Tommy S. Montoya, Portland; Douglas G. Bennett, Beaverton; William E. Root, West Linn; Jim D. Williams, Portland, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/633,484

(22) Filed: Aug. 7, 2000

(51) Int. Cl.⁷ ................................. H05K 7/14
(52) U.S. Cl. .............. 361/685; 361/683; 361/725; 312/223.1; 211/41.17
(58) Field of Search .......................... 361/681, 683–685, 361/721–727, 753, 759, 788, 801, 802, 816, 818, 797–798; 312/223.1, 223.2, 319.1, 319.2; 211/41.17; 206/701, 702; 174/35 R; 70/57, 58; 360/137 D, 900, 97.01, 98.01; 248/581, 60, 609, 611, 346.03, 504, 346.04

(56) References Cited

U.S. PATENT DOCUMENTS

| | | | | |
|---|---|---|---|---|
| 5,327,323 A | * | 7/1994 | Yeom et al. | 361/685 |
| 5,602,717 A | * | 2/1997 | Leshem et al. | 361/685 |
| 5,654,873 A | * | 8/1997 | Smithson et al. | 361/685 |
| 5,673,172 A | * | 9/1997 | Hastings et al. | 361/685 |
| 5,751,551 A | * | 5/1998 | Hileman et al. | 361/753 |
| 5,978,212 A | * | 11/1999 | Boulay et al. | 361/685 |
| 6,058,016 A | * | 5/2000 | Anderson et al. | 361/727 |
| 6,067,225 A | * | 5/2000 | Reznikov et al. | 361/685 |
| 6,069,789 A | * | 5/2000 | Jung | 361/684 |
| 6,249,432 B1 | * | 6/2001 | Gamble et al. | 361/685 |
| 6,272,010 B1 | * | 8/2001 | Schmitt | 361/685 |
| 6,228,902 B1 | * | 9/2001 | Kim et al. | 361/725 |

* cited by examiner

Primary Examiner—Darren Schulberg
Assistant Examiner—Michael Datskovsky
(74) Attorney, Agent, or Firm—Mark V. Seeley

(57) ABSTRACT

A hot swap disk drive carrier and drive bay with improved EMI/RVI/ESD suppression characteristics is disclosed. The disk drive carrier comprises a frame that has a base, and first and second arms that are coupled to the base. The carrier further includes a handle, which is coupled to the base, and slide rails that are coupled to the first and second arms. The disk drive bay comprises a plate that has first and second sides. The plate is coupled to first and second walls. These walls have grooves for receiving the disk drive carrier's slide rails.

16 Claims, 3 Drawing Sheets

HOT SWAP DISK DRIVE CARRIER AND DISK DRIVE BAY

FIELD OF THE INVENTION

The present invention relates to disk drive carriers and disk drive bays for receiving such carriers. More specifically, the invention relates to carriers and bays for hot swappable disk drives, i.e., disk drives that may be removed from a computer assembly without having to power down the computer.

BACKGROUND OF THE INVENTION

A computer system may use multiple disk drives to store large volumes of data. When such a system includes a redundant array of independent disks ("RAID"—also sometimes called a redundant array of inexpensive disks), it may remain operational, even when a drive must be replaced. Disk drives that may be replaced without powering down the system are said to be "hot swappable."

Current RAID assemblies require relatively large enclosures to store high speed (e.g., 10K RPM or higher), high density, hot swappable disk drives. In addition, when such disk drives are used in such assemblies, rotational vibration interference ("RVI") can adversely affect system performance, e.g., by slowing down data transmission from the drives.

Accordingly, there is a need for an improved hot swap disk drive carrier and disk drive bay. There is a need for such a carrier and bay that reduces RVI, preferably such that RVI degrades performance by less than 1%. In addition, there is a need for such a storage assembly that enables a relatively low volume enclosure to store multiple disk drives. The hot swap disk drive carrier and disk drive bay of the present invention provides such an assembly.

DETAILED DESCRIPTION OF THE PRESENT INVENTION

A hot swap disk drive carrier and disk drive bay are described. The disk drive carrier comprises a frame that has a base, a first arm coupled to the base, and a second arm coupled to the base. The carrier further includes a handle that is coupled to the base, a first slide rail that is coupled to the first arm, and a second slide rail that is coupled to the second arm. The disk drive bay comprises a plate, which has a first side and a second side. The first side is oriented substantially parallel to the second side. A first wall is coupled to the first side of the plate, and a second wall is coupled to the second side of the plate. The first and second walls each have grooves for receiving the disk drive carrier's slide rails.

In the following description, numerous details are set forth to provide a thorough understanding of the present invention. However, it will be apparent to those skilled in the art that the invention may be practiced in many ways other than those expressly described here. The invention is thus not limited by the specific details disclosed below.

Figure 1:
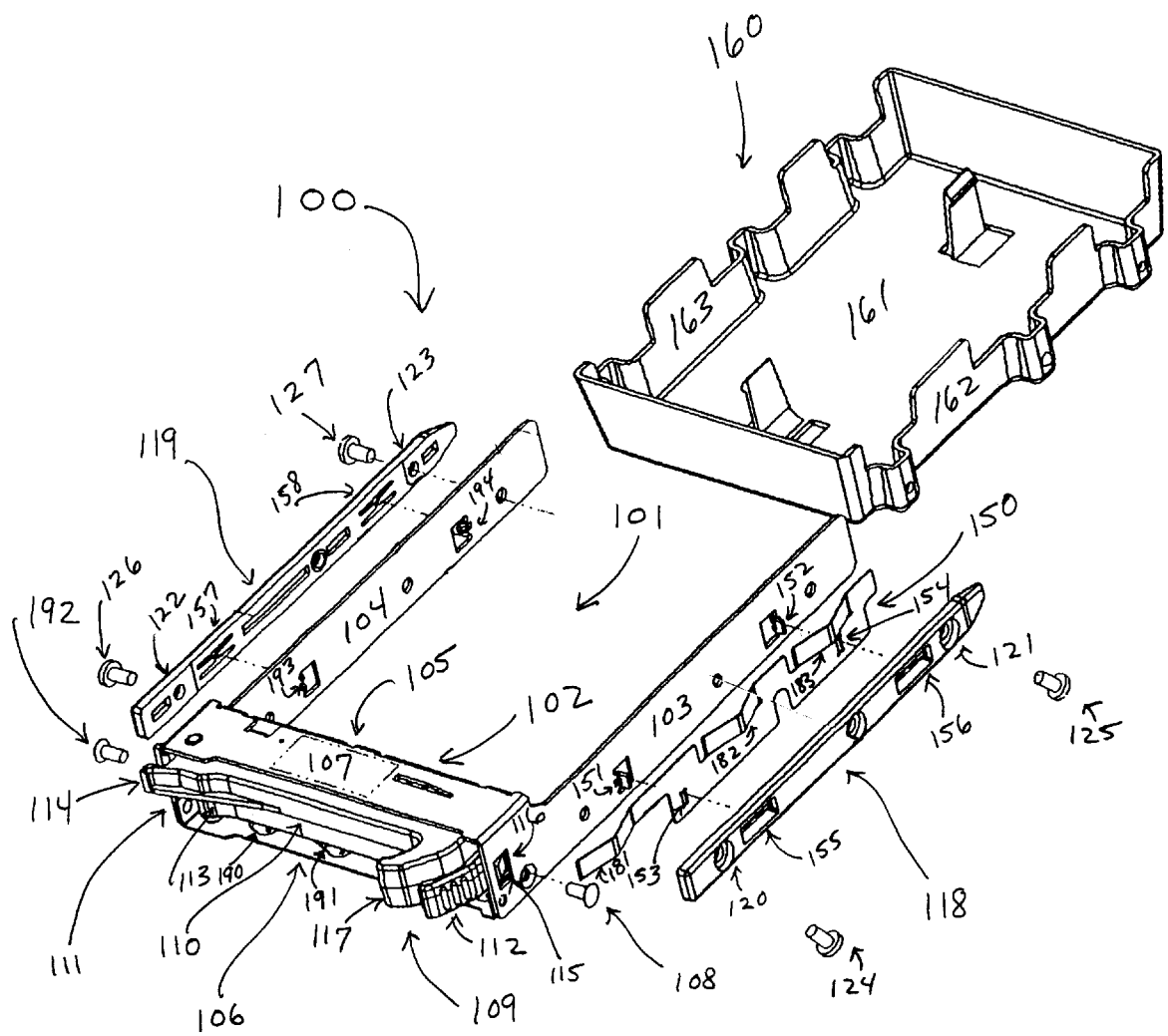
FIG. 1 is a partially exploded view of a first embodiment of the disk drive carrier of the present invention.

As shown in FIG. 1, disk drive carrier 100 comprises frame 101 and handle 110. Frame 101 includes base 102, first arm 103, and second arm 104. In this embodiment, base 102 includes upper member 105 and lower member 106. As shown, upper member 105 is an integrated, U-shaped, rigid support structure that includes shelf 107, first arm 103 and second arm 104. Lower member 106, as shown, is an integrated, U-shaped, rigid support structure that is coupled at each end to upper member 105, e.g., by rivets 108 and 192. In a preferred embodiment of the present invention, upper member 105 is made from sheet metal and lower member 106 is made from stainless steel.

Handle 110 is positioned between upper member 105 and lower member 106 of base 102. Handle 110 includes first end 109 and second end 111. End 109 includes pawl 112, and end 111 includes pin 113 and mechanical lever or latch 114. Pin 113, which is coupled to both upper member 105 and lower member 106, enables handle 110 to rotate from an open position to a closed position. When rib 115 of pawl 112 passes through aperture 116, which is formed in arm 103, handle 110 is locked into the closed position—as shown here. When in that position, mechanical latch 114 can engage an aperture formed in the side of a drive bay to lock disk drive carrier 100 to the drive bay.

Handle 110 may be released from the closed position by squeezing pawl 112 and shoulder 117, which will cause rib 115 to slip below aperture 116, enabling pawl 112 to disengage from aperture 116. Releasing pawl 112 from aperture 116, and releasing mechanical latch 114 from its corresponding drive bay socket, enables disk drive carrier 100 to be removed from a disk drive bay. In a preferred embodiment, handle 110 comprises a one piece integrated structure formed from a high strength engineering plastic, such as a polycarbonate.

Disk drive carrier 100 further includes first slide rail 118, which is coupled to arm 103, and second slide rail 119, which is coupled to arm 104. Rails 118 and 119 will slide into grooves formed in drive bay side walls, when carrier 100 is inserted into a drive bay. Inserting these rails into such grooves will help reduce RVI that could otherwise occur. Rails 118 and 119 are preferably made from a high density polymer, e.g., a polyamide based engineering plastic like those available from BASF Aktiengesellschaft under the trademark Ultramid®. Although such materials are preferred, rails 118 and 119 may be made from other materials of equal hardness that have shock absorbing properties and that are relatively slick, which enables the rails to easily slide along drive bay grooves—providing excellent ergonomic feel.

In this embodiment, rails 118 and 119 includes openings 120, 121 and 122, 123, respectively. These openings enable screws (e.g., screws 124–127) to pass through the rails, and through matching orifices formed in arms 103 and 104, for engagement with a disk drive that may be attached to carrier 100. When that occurs, the disk drive, in essence, contributes part of the support structure for the disk drive carrier. By using the disk drive in this way, such a design reduces the size of the disk drive carrier/disk drive assembly. This, in turn, enables a reduction in the size of the disk drive bay used to store multiple drives.

EMI/RVI/ESD spring 150 may be positioned between first slide rail 118 and first arm 103 to block electromagnetic emissions and protect against electrostatic discharge. In this embodiment, spring 150 is coupled to arm 103 and rail 118 by inserting projecting members 151 and 152, formed on arm 103, through apertures 153 and 154, formed in spring 150, for engagement with slots 155 and 156, formed in rail 118. In this embodiment, slots 155 and 156 include flexible tabs that snap onto projecting members 151 and 152 to connect rail 118 to arm 103, binding spring 150 in between them. Similarly, flexible tabs, positioned within slots 157 and 158, formed on rail 119, engage projecting members 193 and 194, formed on arm 104, to connect rail 119 to arm 104.

In the embodiment of the present invention shown in FIG. 1, EMI/RVI/ESD spring 150 includes bent flexible sections 181, 182 and 183. Because slide rail 118 contacts spring 150 underneath those sections, they will contact a drive bay side wall, when the carrier is inserted in a drive bay. The flexible nature of those sections ensures good contact with the drive bay side wall, which enables electrostatic discharge from the carrier assembly to the system chassis ground. By grounding out ESD under normal operating conditions, this design will eliminate data errors that such ESD might otherwise cause.

Note the force that a drive bay wall will apply to these bent sections (as they are inserted into the drive bay) will push carrier 100 in the direction of rail 119, promoting a snug fit between rail 119 and the corresponding drive bay groove. EMI/RVI/ESD spring 150 is preferably made from stainless steel, but may be made from other noncorrosive materials that provide the desired flexibility and electrical characteristics.

When a disk drive is not attached to disk drive carrier 100, carrier 100 includes air baffle 160. Baffle 160 includes base 161, first side 162, and second side 163. When carrier 100 includes baffle 160, screws 124–127 will pass through rails 118 and 119 and through arms 103 and 104 for attachment to sides 162 and 163, connecting the arms to the baffle. When a system's drive bay includes more disk drive positions than are actually used, carriers that include such a baffle must be inserted into the disk drive positions that do not receive drives to facilitate proper airflow through the storage assembly. In a preferred embodiment, air baffle 160 is made from an engineering thermoplastic, such as a polycarbonate or polycarbonate blend.

In this embodiment of the present invention, disk drive carrier 100 is grounded to the chassis with five grounding clips, e.g., clips 190 and 191, which are formed in lower member 106. Grounding clips 190 and 191 may be made from an electrically conductive material that has spring like characteristics, such as stainless steel. Such clips form a spring loaded arc that compresses when pressure is applied to their surface. When carrier 100 is inserted into a drive bay, clips 190 and 191 will either contact a drive bay surface or an adjacent carrier and compress—causing an electromechanical connection. That connection may provide additional stability to the drive. In addition, the electromechanical connection provides a low insertion force ground for carrier 100 and an attached disk drive, as carrier 100 is being inserted into the drive bay and before a disk drive connector mates with a high speed back plane. Grounding the carrier before contact with the back plane provides a conductive path that ensures EMI suppression.

Figure 2:
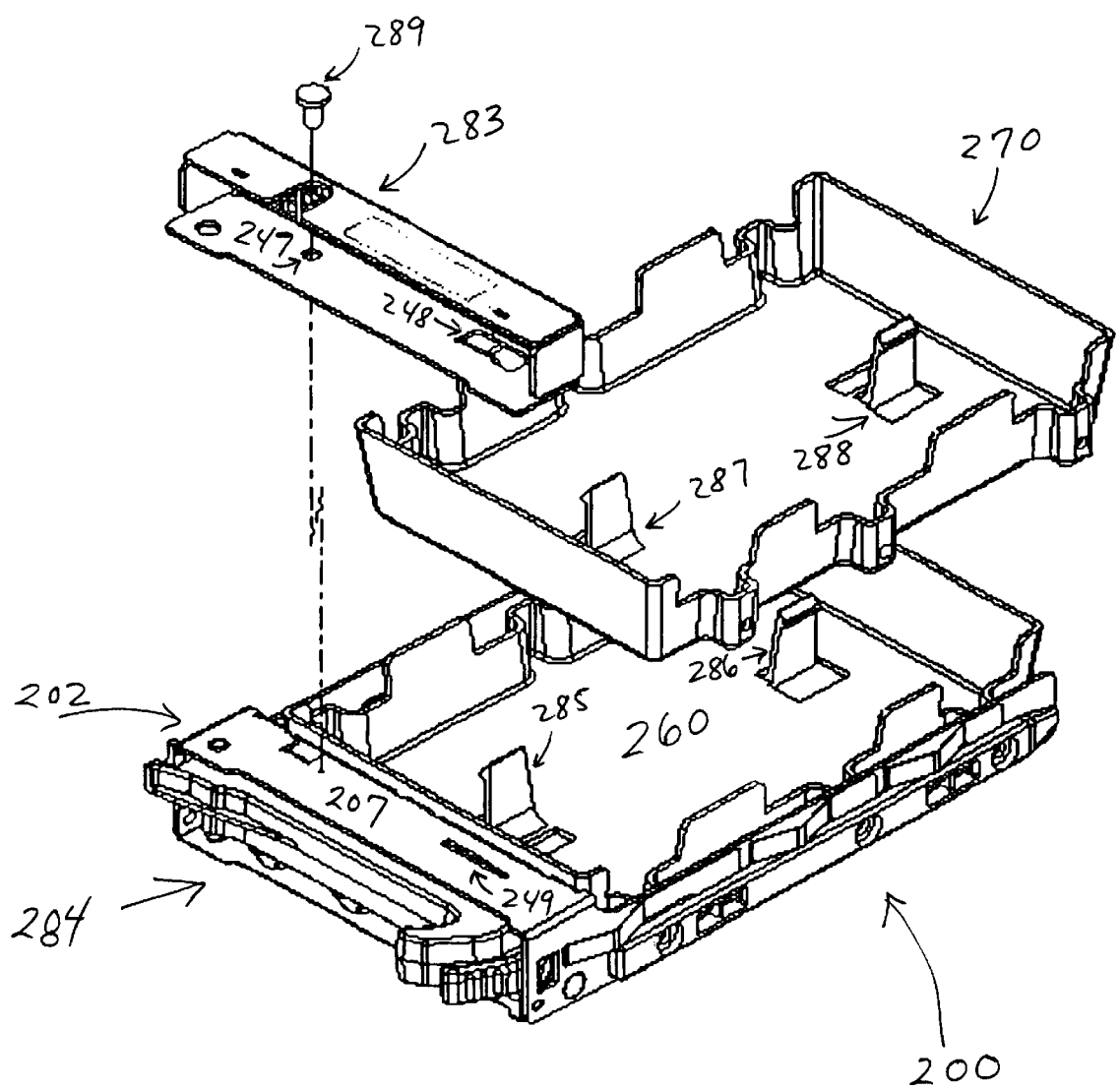
FIG. 2 is a partially exploded view of a second embodiment of the disk drive carrier of the present invention.

The embodiment of the hot swap disk drive carrier of the present invention, which is shown in FIG. 1, is especially designed to receive a 1 inch disk drive. FIG. 2 illustrates a second embodiment of the hot swap disk drive carrier of the present invention to accommodate a 1.6 inch disk drive. This embodiment includes similar components and features to those shown in FIG. 1, but additionally includes a second air baffle 270 and carrier extension 283.

Baffle 270 and extension 283 enable carrier 200 to be used in systems that accommodate a thicker drive by increasing the thickness of front portion 284 of carrier 200 and the thickness of the baffle. In this embodiment, second baffle 270 is identical to first baffle 260. Second baffle 270 can be nested inside, and locked to, baffle 260 by rotating baffle 270 1800 degrees from the orientation of baffle 260, dropping baffle 270 onto baffle 260 and locking the baffles together by inserting clips 285 and 286, formed on baffle 260, through slots 287 and 288, formed on baffle 270.

Carrier extension 283 may be attached to shelf 207 of frame 202 by passing screw 289 through aperture 247 for engagement with a corresponding slot formed on one end of shelf 207, and by sliding a hook, formed within slot 248 of extension 283, into slot 249, formed on the other end of shelf 207.

Figure 3:
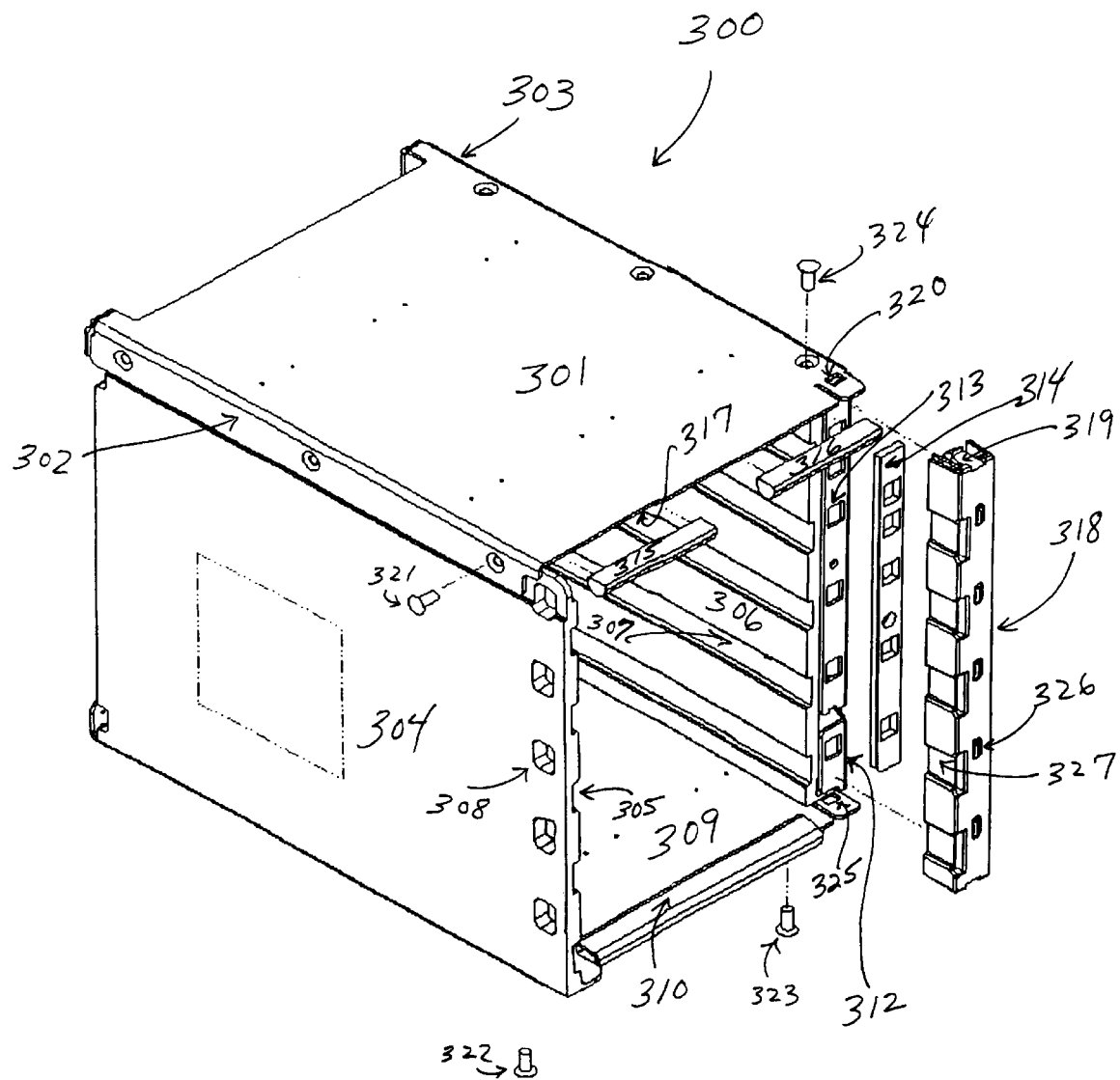
FIG. 3 is a partially exploded view of an embodiment of the disk drive bay of the present invention.

FIG. 3 illustrates an embodiment of the disk drive bay of the present invention. Drive bay 300 can receive several 5.25 inch disk drives, which preferably include a standard hot swap connection. Drive bay 300 includes plate 301, which has first side 302 and second side 303. First side 302 is oriented substantially parallel to second side 303. First wall 304 is coupled to side 302 of plate 300. In this embodiment, wall 304 includes five grooves 305 for receiving disk drive carrier slide rails positioned on one side of the disk drives. Second wall 306 is coupled to side 303 of plate 300. Wall 306 also includes five grooves 307 for receiving disk drive carrier slide rails positioned on the opposite side of the disk drives.

Plate 301 is preferably formed from sheet metal and walls 304 and 306 each preferably comprise extruded aluminum. Wall 304 includes apertures 308 for receiving a mechanical lever or latch that is formed on a disk drive carrier handle. As explained above, when the disk drive carrier of the present invention is inserted into such a drive bay, the mechanical latch that is formed on one end of the carrier handle will lock into aperture 308.

Drive bay 300 also includes second plate 309. Plate 309, like plate 301, may be made from sheet metal. Plate 309 is connected to walls 304 and 306 and includes contact surface 310, for contacting grounding clips that are located on a disk drive carrier, and bent strip 312. Bent strip 312 includes apertures 313, which permit light to pass through them from the space formed between second wall 306 and an overlying section of sheet metal, while ensuring EMI suppression. Such light may be generated by LEDs positioned within that space for providing system status information. The above described plates and walls may be coupled together using various types of connectors, e.g., rivets 321–324.

First foam gasket 314 is placed over strip 312. Gasket 314 preferably includes an electrically conductive woven fabric, which performs an EMI/ESD blocking function. Second and third foam gaskets 315 and 316 will be placed on interior surface 317 of plate 301. Gaskets 315 and 316 also preferably include an electrically conductive woven fabric, which performs an EMI/ESD blocking function. LED cover 318 may be placed over gasket 314, primarily for aesthetic reasons. Tab 319 of cover 318 slips into slot 320 of plate 301, and a corresponding tab on the other end of cover 318 slips into corresponding slot 325 of plate 309 to connect cover 318 to drive bay 300. Light will shine through plastic coverings 326, and grooves 327 will enable carrier rails to slide over cover 318 to reach wall 306.

Although this embodiment of the drive bay of the present invention accommodates five 1 inch disk drives, other embodiments may handle more or less drives and may handle 1.6 inch drives instead of 1 inch drives. In this respect, the drive bay of the present invention may be used in rack mounted chassis for entry level systems (e.g., low profile systems having a single disk drive and other systems with four or less drives) through high end systems that may accommodate twelve or more disk drives.

An improved disk drive carrier and disk drive bay have been described. Such a storage assembly enables a low cost hot swap capable disk drive carrier/drive bay system that reduces RVI and suppresses EMI and ESD. This combination yields a cost effective design for storing one or more high speed, high density, disk drives in a relatively small volumetric space. When the carrier's slide rails are inserted into the drive bay's grooves, disk drive movement is restricted, which serves to minimize RVI by transferring vibration to the drive bay walls via the carrier's slide rails.

Features shown in the above referenced drawings are not intended to be drawn to scale, nor are they intended to be shown in precise positional relationship. Additional components that may be included in the illustrated disk drive carrier and drive bay have been omitted as they are not useful to describe aspects of the present invention.

Although the foregoing description has specified a disk drive carrier and drive bay that includes certain features, those skilled in the art will appreciate that many modifications and substitutions may be made. It is intended that all such modifications, alterations, substitutions and additions be considered to fall within the spirit and scope of the invention as defined by the appended claims.

What is claimed is:

1. A disk drive carrier comprising:
   a frame having a base, a first arm coupled to a first end of the base, and a second arm coupled to a second end of the base;
   a handle that is coupled to the base;
   a first slide rail that is coupled to the first arm; and
   a second slide rail that is coupled to the second arm,
   wherein the handle has a first end and a second end, the first end including a pawl for coupling the handle to an aperture formed in the first arm, and the second end including:
      a pin for coupling the handle to the base, and
      a mechanical latch, oriented substantially perpendicular to the pin, for insertion into an aperture formed in a side wall of a disk drive bay.

2. The disk drive carrier of claim 1 further comprising an EMI/RVI/ESD spring that is positioned between the first slide rail and the first arm.

3. The disk drive carrier of claim 2 wherein the spring comprises a bent flexible section, the first slide rail contacting the spring underneath that bent flexible section.

4. The disk drive carrier of claim 3 further comprising an air baffle that has a base, a first side, and a second side, the first side being attached to the first arm and the second side being attached to the second arm.

5. The disk drive carrier of claim 4 further comprising a second air baffle and a carrier extension, the second air baffle being nested inside, and locked to, the first air baffle, and the carrier extension being coupled to the base.

6. The disk drive carrier of claim 5 wherein the base comprises an upper member and a lower member, the handle being positioned between them, and the disk drive further comprising a grounding clip that is coupled to the lower member.

7. A disk drive assembly comprising:
   a disk drive carrier comprising:
      a frame having a base, a first arm coupled to a first end of the base, and a second arm coupled to a second end of the base;
      a handle that is coupled to the base;
      a first slide rail that is coupled to the first arm; and
      a second slide rail that is coupled to the second arm;
   a disk drive, having a first side and a second side, the first side being coupled to the first arm and the second side being coupled to the second arm, and
   an EMI/RVI/ESD spring that is positioned between the first slide rail and the first arm, the spring comprising a bent flexible section, the first slide rail contacting the spring underneath that bent flexible section.

8. A disk drive bay comprising:
   a first plate, having a first side and a second side, the first side oriented substantially parallel to the second side;
   a first wall, coupled to the first side of the plate, the first wall having a groove for receiving a first slide rail of a disk drive carrier; and
   a second wall, coupled to the second side of the plate, the second wall including a groove for receiving a second slide rail of the disk drive carrier,
   wherein the first wall includes an aperture for receiving a mechanical latch formed on a disk drive carrier handle for locking a disk drive carrier to the drive bay.

9. The disk drive bay of claim 8 wherein each wall includes a plurality of grooves for receiving disk drive carrier slide rails.

10. The disk drive bay of claim 8 wherein the first and second walls are formed from extruded aluminum.

11. The disk drive bay of claim 8 further comprising a second plate that faces the first plate, the second plate being coupled to the first and second walls and having a contact surface for contacting a grounding clip that is formed on a disk drive carrier.

12. The disk drive bay of claim 11 wherein the second plate includes a bent strip that includes an aperture that permits light to pass through it.

13. The disk drive bay of claim 12 further comprising a first foam gasket, which includes an electrically conductive material, that is placed over the bent strip, and further comprising a second foam gasket, which includes an electrically conductive material, that is attached to an interior surface of the first plate for contacting a disk drive.

14. A storage assembly comprising:
   a disk drive carrier comprising:
      a frame having a base, a first arm coupled to a first end of the base, and a second arm coupled to a second end of the base;
      a handle that is coupled to the base;
      a first slide rail that is coupled to the first arm; and
      a second slide rail that is coupled to the second arm;
   a disk drive, having a first side and a second side, the first side being coupled to the first arm and the second side being coupled to the second arm; and
   a disk drive bay comprising:
      a plate, having a first side and a second side, the first side oriented substantially parallel to the second side;
      a first wall, coupled to the first side of the plate, the first wall having a groove that receives a first slide rail of a disk drive carrier; and
      a second wall, coupled to the second side of the plate, the second wall having a groove that receives a second slide rail of the disk drive carrier,
   wherein the handle has a first end and a second end, the first end including a pawl for coupling the handle to an aperture formed in the first arm, and the second end including a pin for coupling the handle to the base, and a mechanical latch, which is oriented substantially perpendicular to the pin, and wherein the first wall includes an aperture, the latch passing through the aperture to lock the disk drive carrier to the drive bay.

15. The storage assembly of claim 14 further comprising an EMI/RVI/ESD spring that is positioned between the first slide rail and the first arm, the spring comprising a bent flexible section, the bent flexible section contacting the second wall of the drive bay and the first slide rail contacting the spring underneath that bent flexible section.

16. The storage assembly of claim 15 further comprising a second disk drive carrier comprising:

a frame comprising a base, a first arm coupled to a first end of the base, and a second arm coupled to a second end of the base;

a handle that is coupled to the base;

a first slide rail that is coupled to the first arm; and a second slide rail that is coupled to the second arm; and an air baffle that has a base, a first side, and a second side, the first side being attached to the first arm of the second disk drive carrier and the second side being attached to the second arm of the second disk drive carrier.

* * * * *